(12) United States Patent
Tsai et al.

(10) Patent No.: US 9,274,201 B2
(45) Date of Patent: Mar. 1, 2016

(54) AUTOMATIC CALIBRATION METHOD FOR ACTIVE AND REACTIVE POWER MEASUREMENT

(71) Applicant: Texas Instruments Incorporated, Dallas, TX (US)

(72) Inventors: Kaichien Tsai, Plano, TX (US); Minghua Fu, Plano, TX (US); Anand Dabak, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 90 days.

(21) Appl. No.: 14/317,730

(22) Filed: Jun. 27, 2014

(65) Prior Publication Data

US 2015/0061636 A1 Mar. 5, 2015

Related U.S. Application Data

(60) Provisional application No. 61/873,613, filed on Sep. 4, 2013.

(51) Int. Cl.
 *G01R 35/00* (2006.01)
 *G01R 35/04* (2006.01)

(52) U.S. Cl.
 CPC ............. *G01R 35/005* (2013.01); *G01R 35/04* (2013.01)

(58) Field of Classification Search
 None
 See application file for complete search history.

(56) References Cited

U.S. PATENT DOCUMENTS

| 5,384,526 A * | 1/1995 | Bennett | G05B 11/42 318/609 |
| 6,470,225 B1 * | 10/2002 | Yutkowitz | G05B 11/28 700/188 |
| 7,466,254 B2 * | 12/2008 | Latham | H03M 3/344 341/143 |
| 2003/0197632 A1 * | 10/2003 | Rubin | G06F 1/30 341/141 |

* cited by examiner

*Primary Examiner* — Vinh Nguyen
(74) *Attorney, Agent, or Firm* — John R. Pessetto; Frank D. Cimino

(57) ABSTRACT

A system is provided for calibrating a device. The system includes a reference component, a sampling component, a calibration component, a comparing component and a proportional integral component. The reference component provides a reference power signal based on a voltage instruction and a current instruction. The sampling component samples a voltage signal to obtain a sampled voltage value and samples a current signal to obtain a sampled current value. The calibration component generates a calibrated power signal based on the sampled voltage value and the sampled current. The comparing component generates an error signal based on the reference power signal and the calibrated power signal. The proportional integral component and the calibration component are a feedback system that is operable to calibrate the gain of the sampled voltage and the sample current based on the error signal.

16 Claims, 6 Drawing Sheets

AUTOMATIC CALIBRATION METHOD FOR ACTIVE AND REACTIVE POWER MEASUREMENT

The present application claims priority from: U.S. Provisional Application No. 61/873,613 filed Sep. 4, 2013, the entire disclosure of which is incorporated herein by reference.

BACKGROUND

The present invention generally relates to the calibration of devices used for measuring electrical power and energy.

Power in an electric circuit is the rate of flow of energy past a given point of the circuit. In alternating current (AC) circuits and loads, energy storage elements such as inductors and capacitors may result in periodic reversals of the direction of energy flow. The portion of power that, when averaged over a complete cycle of the AC waveform, results in net transfer of energy in one direction is known as real or active power. The portion of power due to stored energy, which returns to the source in each cycle, is known as reactive power.

Electricity meters operate by continuously measuring the instantaneous voltage and current to give energy used in joules or kilowatt-hours. Meters for smaller services, such as small residential customers, can be connected directly in-line between source and customer. For larger loads, more than about 200 amperes, current transformers are used so that the meter can be located other than in line with the service conductors. Meters fall into two basic categories, electromechanical and electronic.

The most common type of electricity meter is the electromechanical induction watt-hour meter which operates by counting the revolutions of a non-magnetic, but electrically conductive, metal disc which is made to rotate at a speed proportional to the power passing through the meter. However, electronic electricity meters are increasingly being installed as they offer many advantages. Electronic meters display the energy used on an LCD or LED display, and some can also transmit readings to remote places. In addition to measuring energy used, electronic meters can also record other parameters of the load and supply such as instantaneous and maximum rate of usage demands, voltages, power factor and reactive power used, etc.

Conventional meters include electronic components and circuits which can introduce gain errors and phase delays into the measurement process. These errors and delays can vary between manufactured units. They can also vary across the gain range of the meter and with the phase angle between the voltage and current at the meter. It is these errors and delays which necessitate calibration of the meter.

Conventional calibration techniques can involve many measurements including active power measurements, reactive power measurements, measurements at different gain levels, measurements at different phase angles, etc. Conventionally, each of these measurements is performed manually.

A conventional meter calibration set-up will be described using a block diagram.

FIG. 1 shows a block diagram 100 illustrating a conventional meter calibration system.

Block diagram 100 includes a power source tester 102 and a meter 104.

Power source tester 102 is arranged to connect to meter 104 via a power line 108. Meter 104 also connects to power source tester 102 via a line 106.

Power source tester 102 is operable to provide an accurate test voltage, current and phase angle to meter 104. Meter 104 is operable to measure power and to generate calibration pulses 114 to power source tester 102 via line 106.

A voltage 110 and a current 112 represent the voltage and current components, respectively, of power line 108. In operation, voltage 110 and a current 112 represent an accurate reference power with a settable voltage to current phase angle. These are configured and generated at power source tester 102 for the purpose of calibration of meter 104. Meter 104 measures the reference power provided, accumulates power measurements over time and generates a calibration pulse when it has reached a certain predetermined energy threshold. Power source tester 102 then compares the reference energy and measured energy to determine any error. Meter 104 is then manually adjusted to minimize the error.

In practice, multiple measurements are made at different gain settings across the gain range of meter 104. The gain under test is determined by the current setting at power source tester 102. Active power measurements are made when voltage 110 and current 112 are generated in phase with each other. For reactive power measurements, the required phase angle between voltage 110 and current 112 is set at power source tester 102.

Electrical meter calibration, therefore, is conventionally a time-consuming, labor intensive process with multiple test stages being run and multiple reference currents, voltages and phase angles required to be set up at the calibration equipment before tests are run. After testing, manual adjustments need to be made to the meter units under calibration in order to compensate for errors.

What is needed is a system and method that can automate the calibration of electric energy meters and minimize the external test equipment necessary to perform the calibration.

BRIEF SUMMARY

The present invention is drawn to a system and method that can automate the calibration of electric energy meters and minimize the external test equipment necessary to perform the calibration.

An aspect of the present invention is drawn to a system for calibrating a device. The system includes a reference component, a sampling component, a calibration component, a comparing component and a proportional integral component. The reference component provides a reference power signal based on a voltage instruction and a current instruction. The sampling component samples a voltage signal to obtain a sampled voltage value and samples a current signal to obtain a sampled current value. The calibration component generates a calibrated power signal based on the sampled voltage value and the sampled current. The comparing component generates an error signal based on the reference power signal and the calibrated power signal. The proportional integral component and the calibration component are a feedback system that is operable to calibrate the gain of the sampled voltage and the sample current based on the error signal.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate exemplary embodiments of the present invention and, together with the description, serve to explain the principles of the invention. In the drawings.

DETAILED DESCRIPTION

A first aspect of the present invention provides a reference component within the meter under calibration to instruction an external power source to generate a series of accurate analog reference powers consisting of reference voltages, reference currents and reference phase angles suitable for the meter under calibration such that the meter can be largely self-calibrated.

A second aspect of the present invention provides a sampling component within the meter under calibration to condition the received reference voltages and currents for digital processing and to then sample and generate digital versions of the sampled powers.

A third aspect of the present invention provides within the meter under calibration a feedback loop that includes a comparator, a proportional-integral (PI) component and a calibration component. These components compare the sampled powers with the reference powers in order to produce gain values or phase angle values which, when added to the sampled powers or phase angles, generates calibrated powers or phase angles which attempt to equal the reference. The calibrated powers or phase angles are then used in the feedback loop such that the calibrated values converge on the reference values.

Another aspect of the present invention is drawn to a processor component with a memory component to store and process the gain calibration values and phase angle calibration values for use by the meter in its role to compute and provide accurate, calibrated measurements.

The present invention provides a unique system and method for automation of the calibration of electrical energy meters which has considerable advantages over conventional manual systems and methods. Example embodiments of the system may also embed much of the test functions into the meter itself, thus minimizing the external test equipment necessary for the calibration.

Aspects of the present invention are additionally drawn to a reference component that may instruction the generation of predetermined reference powers; a sampling component to process and digitize the voltages, currents and phase angles of the reference powers; a feedback loop and calibration component to determine power and phase angle errors and calibration values; and a processor with a memory component to store the calibration values and use them to venerate calibrated measurements.

A system and method in accordance with these aspects can provide significant advantages over conventional systems and methods in calibration equipment, time and labor, especially for low current calibration and meters utilizing multiple gain stages. Example aspects will now be anther described with reference to FIGS. 2-6.

Figure 1:
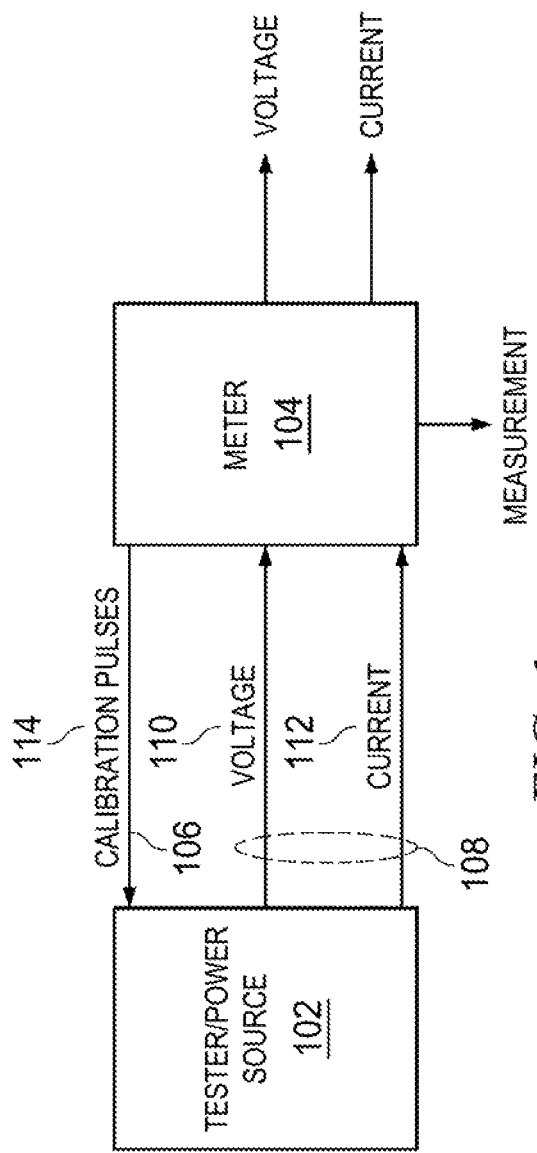
FIG. 1 shows a block diagram illustrating a conventional meter calibration system.
Figure 2:
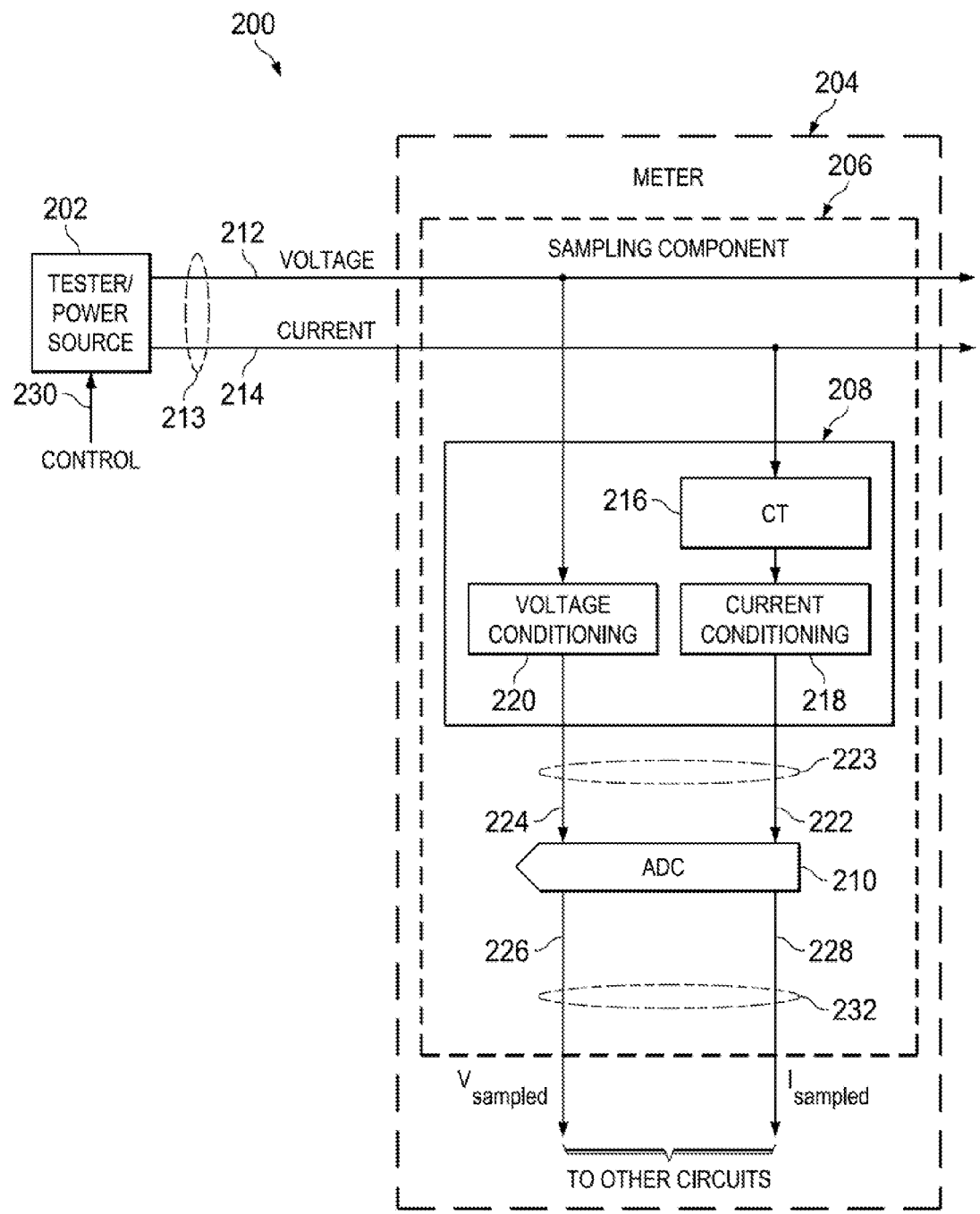
FIG. 2 shows a block diagram illustrating the sampling component of a meter calibration system in accordance with aspects of the present invention.

FIG. 2 shows a block diagram 200 illustrating the sampling component of a meter calibration system in accordance with aspects of the present invention.

Block diagram 200 includes a power source tester 202 and a meter 204. Power source tester 202 and meter 204 are shown as independent components in this example. However, in some embodiments, power source tester 202 and meter 204 may be combined as a unitary component.

Meter 204 includes a sampling component 206 and other circuits not shown in the figure but which are described by later figures. Sampling component 206 includes a conditioning component 208 and an Analog to Digital Converter (ADC) 210. Conditioning component 208 and ADC 210 are shown as independent components in this example. However, in some embodiments, conditioning component 208 and ADC 210 may be combined as a unitary component.

Conditioning component 208 includes a current transformer (CT) 216, a current conditioning circuit 218 and a voltage conditioning circuit 220. CT 216, current conditioning circuit 218 and a voltage conditioning circuit 220 are shown as independent components in this example. However, in some embodiments, CT 216, current conditioning circuit 218 and a voltage conditioning circuit 220 may be combined as a unitary component.

Power source tester 202 is arranged to connect to meter 204 via a power line 213. Current conditioner 218 and voltage conditioner 220 are arranged to connect to ADC 210 via a power line 223. A voltage line 224 and a current line 222 represent the voltage and current components, respectively, of power line 223. ADC 210 is arranged to connect to other circuits (not shown) via a power line 232. A voltage line 225 and a current line 227 represent the voltage and current components, respectively, of power line 232.

Power source tester 202 may be any device or system that is able to provide a test voltage and current to meter 204 in accordance with instructions appearing on a control line 230. Meter 204 may be any device or system that is able to condition, sample and measure voltage and current. CT 216 may be any device or system that is able to provide a reduced, proportional version of current 214 to current conditioner 218. Current conditioner 218 may he any device or system that is able to condition the current component of power line 213. Voltage conditioner 220 may be any device or system that is able to condition the voltage component of power line 213. ADC 210 may be any device or system that is able to sample analog voltage and current waveforms and generate representative digital values. In this manner, the actual voltage and actual current as provided by power source tester 202 is not output by ADC 210. By outputting representative digital values associated with the actual voltage and actual current as provided by power source tester 202, ADC 210 is much more efficient.

In operation, power source tester 202 provides a test voltage and current for calibration purposes to meter 204 using power line 213. Voltage line 212 and current line 214 represent the voltage and current components, respectively, of power line 213, and these are fed to conditioning component 208. The phase angle between the AC voltage and current at voltage line 212 and current line 214 respectively, can also be set by power source tester 202.

For current conditioning, CT 206 is used initially to decouple the current and reduce it (proportionally) to the range required by next stage circuits. Current conditioner 218 and voltage conditioner 230 then provide the final analog processing and filtering stages necessary before digital processing is performed. The conditioned current and voltage are represented in the figure by a current 222 and a voltage 224 which are then fed to ADC 210. ADC 210 performs waveform sampling, analog to digital conversion and digital processing on current 222 and voltage 224, producing a sampled voltage value 226 and a sampled current value 228 to circuits further down the line. These circuits are described below using another block diagram.

It should be noted that the components included in sampling component 206 are the very components that introduce gain errors and phase delays into the measurements and necessitate calibration. Since these errors can vary across the range of gains and phase angles, meter 204 should be calibrated for many ranges of gains and phase angles.

Figure 3:
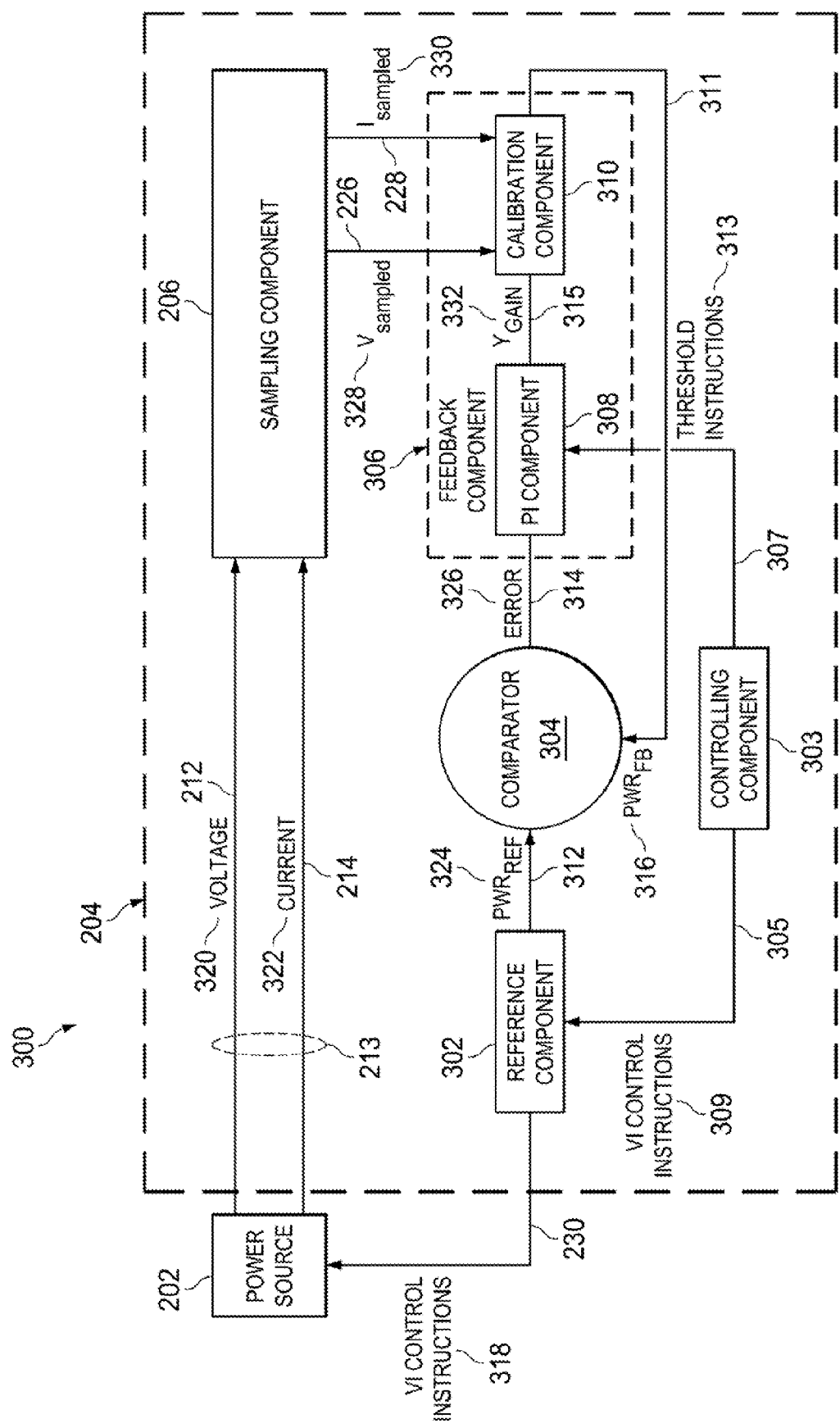
FIG. 3 shows a block diagram illustrating the sampling component and various other components of a meter calibration system in accordance with aspects of the present invention.

FIG. 3 is a block diagram showing sampling component 206 and additional components of an example meter calibration system 300 in accordance with aspects of the present invention.

Block diagram 300 includes power source tester 202 and meter 204. Power source tester 202 and meter 204 are shown as independent components in this example. However, in some embodiments, power source tester 202 and meter 204 may be combined as a unitary component.

As shown here, meter 204 further includes a reference component 302, a controlling component 303, a comparator 304 and a feedback component 306. Reference component 302, controlling component 303, comparator 304 and feedback component 306 are shown as independent components in this example. However, in sonic embodiments, at least two of reference component 302, controlling, component 303, comparator 304 and feedback component 306 may be combined as a unitary component.

Feedback component 306 includes a proportional-integral (PI) component 308 and a calibration component 310. PI component 308 and calibration component 310 are shown as independent components in this example. However, in some embodiments, PI component 308 and calibration component 310 may be combined as a unitary component.

Voltage line 226 and current line 228 are arranged to connect to calibration component 310. Reference component 302 is arranged to connect to power source 202 via control line 230 and to comparator 304 via a line 312. Controlling component 303 is arranged to connect to reference component 302 via a control line 305 and is arranged to connect to PI component 308 via a line 307. Calibration component 310 also connects to comparator 304 via a line 311. Comparator 304 is arranged to connect to PI component 308 via a line 314 and PI component 308 is arranged to connect to calibration component 310 via a line 315.

In the following description of the operability of the components included in the meter calibration system of meter calibration system 300, it should be noted that meter calibration system 300 is operable to calibrate both power values and phase values.

Reference component 302 may be any device or system that is able to provide a reference power and phase signal 312 to comparator 304 and a VI control instruction 318 representative of the reference power and phase signal to power source 202.

Controlling component 303 may be any device or system that is able to generate VI control instructions and to generate threshold instructions.

In some embodiments, controlling component 303 has a set of VI control instructions and threshold instructions for a predetermined gain to be calibrated. In some embodiments, controlling component 303 has a set of VI control instructions and threshold instructions for a predetermined phase to be calibrated. In some embodiments, controlling component 303 has a set of VI control instructions and threshold instructions for a predetermined gain to be calibrated and a set of VI control instructions and threshold instructions for a predetermined phase to be calibrated. In some embodiments, controlling component 303 has a plurality of sets of VI control instructions and threshold instructions for a corresponding plurality of predetermined gains to be calibrated, respectively. In some embodiments, controlling component 303 has a plurality of sets of VI control instructions and threshold instructions for a corresponding plurality of predetermined phases to be calibrated, respectively. In some embodiments, controlling component 303 has a plurality of sets of VI control instructions and threshold instructions for a corresponding plurality of predetermined gains, respectively, and for a corresponding plurality of predetermined phases to be calibrated.

In some embodiments, controlling component 303 has user interface (not shown) to enable a user to determine what gainphase is to be calibrated. Based on input from the user interface, controlling component will access and generate the associated VI control instructions and threshold instructions. Any known interface may be used, non-limiting examples of which include a touch pad, a key board, a touch screen, and a mouse.

In some embodiments, meter calibration system 300 is operable to calibrate a single predetermined gain. A non-limiting example of such in embodiment includes a device that is able to calibrate a single power source having a known predetermined power. In some cases, the device that is able to calibrate a single power source is separate from the single power source, non-limiting examples of which include a battery or an appliance. In some cases, the device that is able to calibrate a single power source is integral with the single power source, examples of which include a printed circuit board. In these embodiments, controlling component 303 generates a single predetermined VI control instruction 309 for reference component 302 and a single predetermined threshold instruction for PI component 308—in the case where PI component 308 does not have a set threshold. This single set of instructions enables meter calibration system 300 to calibrate the single predetermined gain.

In some embodiments, meter calibration system 300 is operable to calibrate a single predetermined phase. A non-limiting example of such an embodiment includes a device that is able to calibrate a single power source having a known predetermined power. In some cases, the device that is able to calibrate a single power source is separate From the single power source, non-limiting examples of which include a battery or an appliance. In some cases, the device that is able to calibrate, a single power source is integral with the single power source, non-limiting examples of which include a printed circuit board. In these embodiments, controlling component 303 generates a single predetermined VI control instruction 309 for reference component 303 and a single predetermined threshold instruction for PI component 308—in the case where PI component 308 does not have a set threshold. This single set of instructions enables meter calibration system 300 to calibrate the single predetermined phase.

In some embodiments, meter calibration system 300 is operable to calibrate a single predetermined gain and a single predetermined phase. A non-limiting example of such an embodiment includes a device that is able to calibrate a single power source having a known predetermined power. In some cases, the device that is able to calibrate a single power source is separate from the single power source, non-limiting examples of which include a battery or an appliance. In some cases, the device that is able to calibrate a single power source is integral with the single power source, non-limiting examples of which include a printed circuit board. In these embodiments, controlling, component 303 generates a single predetermined VI control instruction 309 for reference component 302 for gain calibration and a single predetermined threshold instruction for PI component 308 for gain calibration—in the case where PI component 308 does not have a set threshold, and also generates a single predetermined VI control instruction 309 for reference component 302 for phase calibration and a single predetermined threshold instruction for PI component 308 for phase calibration—in the case where PI component 308 does not have a set threshold. This double set of instructions enables meter calibration system 300 to calibrate the single predetermined gain and the single predetermined phase.

In some embodiments, meter calibration system 300 is operable to calibrate a plurality of predetermined gains, in a predetermined order. A non-limiting example of such an embodiment includes a device that is able to calibrate a single power source having a known predetermined range of power. In some cases, the device that is able to calibrate a single power source is separate from the single power source, non-limiting examples of which include a generator. In some cases, the device that is able to calibrate a single power source is integral with the single power source, non-limiting examples of which include a generator having an integral calibration system. In these embodiments, controlling component 303 may generate a plurality of predetermined VI control instructions 309 for reference component 302 and a corresponding, plurality of predetermined threshold instructions for PI component 308, respectively,—in the case where PI component 308 does not have a set threshold, in the corresponding predetermined order respectively. These plurality of sets instructions enables meter calibration system 300 to calibrate the plurality of predetermined gains in the corresponding predetermined order.

In some embodiments, meter calibration system 300 is operable to calibrate a plurality of predetermined phases, in a predetermined order. A non-limiting example of such an embodiment includes a device that is able to calibrate a single power source having a known predetermined range of power. In some cases, the device that is able to calibrate a single power source is separate from the single power source, non-limiting examples of which include a generator. In some cases, the device that is able to calibrate a single power source is integral with the single power source, non-limiting examples of which include a generator having an integral calibration system. In these embodiments, controlling component 303 may generate a plurality of predetermined VI control instructions 309 for reference component 302 and a corresponding plurality of predetermined threshold instructions for PI component 308, respectively,—in the case where PI component 308 does not have a set threshold, in the corresponding predetermined order, respectively. These plurality of sets instructions enables meter calibration system 300 to calibrate the plurality of predetermined phases in the corresponding predetermined order.

In some embodiments, meter calibration system 300 is operable to calibrate a plurality of predetermined gains and a plurality of predetermined phases, in a predetermined order. A non-limiting example of such an embodiment includes a device that is able to calibrate a single power source having a known predetermined range of power. In some cases, the device that is able to calibrate a single power source is separate from the single power source, non-limiting examples of which include a generator. In some cases, the device that is able to calibrate a single power source is integral with the single power source, non-limiting examples of which include a generator having an integral calibration system. In these embodiments, controlling component 303 generates a plurality of predetermined VI control instructions 309 for reference component 302 for the plurality of gain calibrations and a plurality of predetermined threshold instructions for PI component 308 for gain calibration—in the case where PI component 308 does not have a set threshold, and also generates a plurality of predetermined VI control instructions 309 for reference component 302 for phase calibration and a plurality of predetermined threshold instructions for PI component 308 for phase calibration—in the case where PI component 308 does not have a set threshold. This plurality of sets of instructions enables meter calibration system 300 to calibrate the plurality of predetermined gains and the plurality of predetermined phases, in the predetermined order.

In some embodiments, meter calibration system 300 is operable to calibrate a plurality of predetermined gains and a plurality of predetermined phases, in no particular order. A non-limiting example of such an embodiment includes a device that is able to calibrate any of a plurality of different types of power sources, each of which having its own predetermined range of power, respectively. In some cases, the device that is able to calibrate a single power source is separate from the single power source. In some cases, the device that is able to calibrate a single power source is integral with the single power source. In these embodiments, controlling component 303 can generate any of a plurality of predetermined VI control instructions 309 for reference component 302 for the plurality of gain calibrations and any of a plurality of predetermined threshold instructions for PI component 308 for gain calibration—in the case where PI component 308 does not have a set threshold, and can also generate any of a plurality of predetermined VI control instructions 309 for reference component 302 for phase calibration and any of a plurality of predetermined threshold instructions for PI component 308 for phase calibration—in the case where PI component 308 does not have a set threshold. This plurality of sets of instructions enables meter calibration system 300 to calibrate any of a plurality of predetermined gains and any of a plurality of predetermined phases, in no particular order. In these embodiments, a user may select, by way of the user interface (not shown) in controlling component 303, a particular gain and or phase to be calibrated.

Once generated, a VI control instruction instructs reference component 302 as to what VI control instructions reference component 302 should generate for power source 202. Similarly, once generated, a threshold instruction instructs PI component 308 as to what threshold should be set.

Comparator 304 may be any device or system that is able to compare an input provided at line 312 with an input provided at line 311 and to output a result of the comparison to line 314. In an example embodiment, comparator 304 is operable to produce an error signal that is proportional to the difference between the gains or the phases at its inputs.

PI component 308 may be any device or system that is able to calculate an error value as the difference between measured variables and a desired threshold. In an example embodiment, PI component 308 is operable to produce a gain or phase value which compensates for and eliminates the gain or phase error from comparator 304. In some embodiments, the desired threshold is intrinsic in PI component 308. In other embodiments, the threshold may be set in PI component 308 based on threshold instruction 313 from controlling component 303.

Calibration component 310 may be any device or system that is able to add the gain or phase value from PI component 308 to the sampled gains and phases derived from sampling component 206 to produce a feedback gain or phase value to comparator 304.

It should be noted at this point that calibration of a meter such as meter 204, is performed using a plurality of test stages. As explained previously, calibration is needed due to power and phase delay errors caused by the components of the system such as current transformer 216, conditioning circuits and ADC circuit 210. Since these errors can themselves vary across the entire range of gains and phase angles that the meter is capable of measuring, calibration is done at a plurality of settings across the ranges. Calibration at different gain settings is achieved by measuring voltage at various settable fixed current and voltage values.

Since active power occurs when voltage and current are in phase, active power gain calibration is done when the phases of voltage and current are set to be the same. The Phase angle of 0° is chosen for active power gain calibration, since the contribution of any phase angle error at 0° is minimal.

While the components of the meter calibration system 300 are operable to calibrate both power and phase angle, it should be noted that the operation of the meter calibration system of block diagram 300 will be described for an active power calibration of a single gain setting only. Operation for calibration of other gain settings and phases will be described using additional figures.

From the figure, controlling component 303 generates VI control instruction 309 to instruct reference component 302 as to what gain is to be generated by power source 202. Controlling component 303 generates threshold instruction 313 to instruct PI component 308 to set a particular threshold—in the event that PI component 308 does not intrinsically set the threshold.

Reference component 302 generates a VI control instruction 318 to instruction power source 202 to generate a reference voltage 320 and a reference current 322, which represents the first gain setting to be calibrated, and phase angle 0° between voltage and current since this is an active power calibration. Reference component 302 also provides to comparator 304 a reference power signal, $PWR_{REF}$, 324 which represents the same voltage, current and phase angle being instructed to power source 202.

Sampling component 206 provides the conditioning circuits and A/D conversion, as described previously, to digitally sample reference voltage 320 and reference current 322 and provide the results to calibration component 310 as a sample voltage 328 and a sample current 330. Calibration component 310 computes a power gain from sample voltage 328 and sample current 330 and adds a gain parameter, $Y_{GAIN}$, 332 to produce a calibrated power signal, $PWR_{FB}$, 316 to comparator 304. Initially, $Y_{GAIN}$ is calculated based on an ideal parameter of CT 216 and gain parameters of current conditioning circuit 218 and voltage conditioning circuit 220. PI component 308 will then calculate and obtain a new $Y_{GAIN}$, as discussed below.

Comparator 304 then compares $PWR_{REF}$ 324 to $PWR_{FB}$ 316 and generates an error value 326 proportional to the difference between them. PI component 308 then uses error value 326 to modify $Y_{GAIN}$ 332 in order that the error is eliminated and $PWR_{FB}$ becomes the same as $PWR_{REF}$ at comparator 304. In practice, this is an iterative process and repeats until $Y_{GAIN}$ has stabilized within the predetermined threshold at which point the calibration process stops and $Y_{GAIN}$ is stored for voltage 320 and current 322. This is represented by equation (1) below.

$$\text{Calibrated Power} = PWR_{REF} = Y_{GAIN} * \text{Uncalibrated Power} \quad (1)$$

Figure 4:
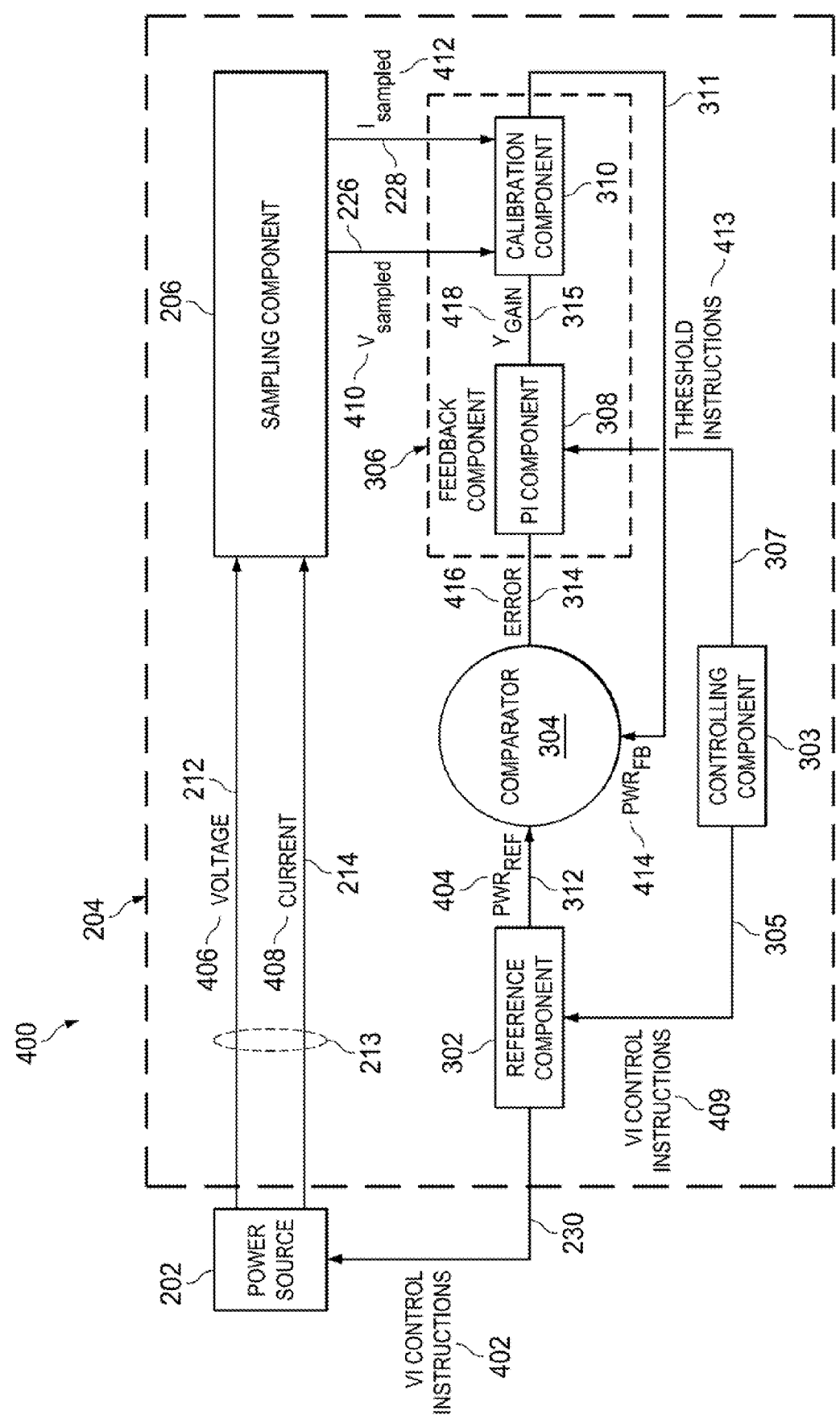
FIG. 4 shows a block diagram illustrating components of a meter calibration system in accordance with aspects of the present invention where the reference power has changed from previous values used.

FIG. 4 is block diagrm showing meter calibration system 300, but where the reference power has changed from that discussed above with reference to FIG. 3.

From the figure, controlling component 303 generates VI control instruction 409 to instruct reference component 302 as to what gain is to be generated by power source 202. Controlling component 303 generates threshold instruction 413 to instruct PI component 308 to set a particular threshold—in the event that PI component 308 does not intrinsically set the threshold.

In the figure, reference component 302 generates a VI control instruction 402, which instructions power source 202 to generate a voltage 406 and a reference current 408, which represents the second gain setting to be calibrated, and phase angle 0° between voltage and current. In this example, voltage 406 is different from voltage 320 discussed above with reference to FIG. 3, and current 408 is different from current 322 discussed above with reference to FIG. 3. Reference component 302 also provides to comparator 304 a reference power signal, $PWR_{REF}$, 404, which represents the same voltage, current and phase angle being instructed to power source 202.

Sampling component 206 provides the conditioning circuits and A/D conversion, as described previously, to digitally sample voltage 406 and current 408 and provide the results to calibration component 310 as a sample voltage 410 and a sample current 412. Calibration component 310 computes a power gain from sample voltage 410 and sample current 412 and adds a gain parameter. $Y_{GAIN}$, 418 to produce a calibrated power signal, $PWR_{FB}$, 414 to comparator 304.

Comparator 304 then compares $PWR_{REF}$ 404 to $PWR_{FB}$ 414 and generates an error value 416 proportional to the difference between them. PI component 308 then uses error value 416 to modify $Y_{GAIN}$ 418 in order that the error is eliminated and $PWR_{FB}$ 414 becomes the same as $PWR_{REF}$ 404 at comparator 304. Again, as for FIG. 3, this is an iterative process and repeats until $Y_{GAIN}$ 418 has stabilized within a defined fluctuation at which point the calibration process stops and $Y_{GAIN}$ 418 is stored for voltage 406 and current 408. This is represented by equation (1) above.

FIG. 3 and FIG. 4 therefore illustrate how a system and method in accordance with aspects of the present invention can perform the power calibration of an electricity meter using a plurality of active power gain measurements at different gain settings.

The system can also be used to calibrate the phase angle between voltage and current. This can be further explained using FIG. 5.

Figure 5:
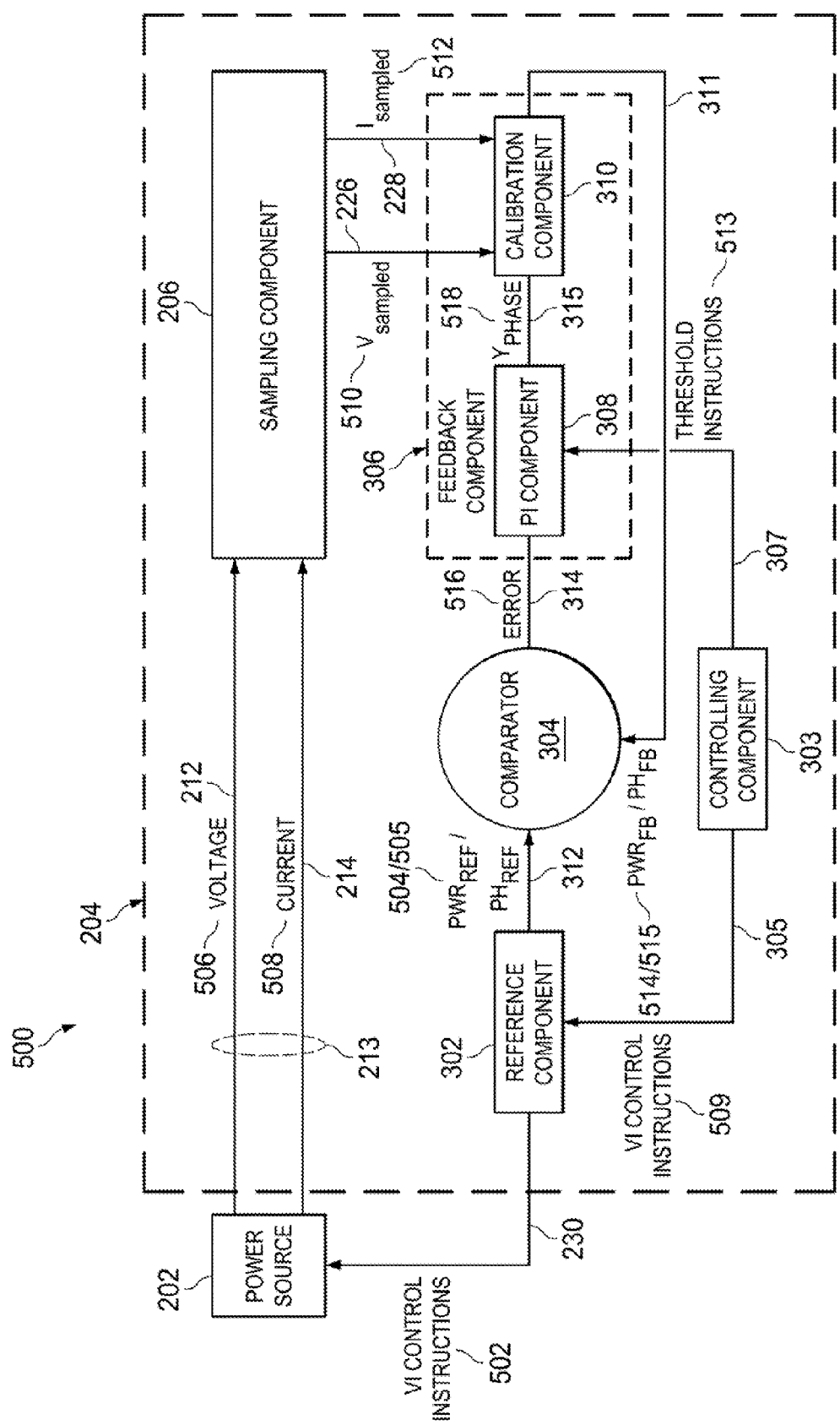
FIG. 5 shows a block diagram illustrating components of a meter calibration system in accordance with aspects of the present invention where phase angle calibration is considered.

FIG. 5 showing meter calibration system 300 as used for calibrating phase angle.

From the figure, controlling component 303 generates VI control instruction 509 to instruct reference component 302 as to phase is to be generated by power source 202. Controlling component 303 generates threshold instruction 513 to instruct PI component 308 to set a particular threshold—in the event that PI component 308 does not intrinsically set the threshold.

Reference component 302 generates a VI control instruction 502, which instructs power source 202 to generate a voltage 506 and a reference current 508, and sets at power source 202 a non-zero phase angle between voltage and current.

It should be noted that phase angle calibration is best done at phase angles between voltage and current of ±60° or at higher angles where the error contribution to overall phase angle is largest due to the power factor which is proportional to cos θ. The delay caused by conditioning circuits, CT and ADC can be more easily identified and calibrated at these angles.

Reference component 302 provides to comparator 304 a reference power signal, $PWR_{REF}$, 504, the voltage and current components of which have a reference phase angle, $PH_{REF}$, 505. These represent the same power and phase angle being instructed to power source 202. Sampling component 206 provides the conditioning circuits and A/D conversion, as described previously, to digitally sample voltage 506 and current 508 and provide the results to calibration component 310 as a sample voltage 510 and a sample current 512 with a phase angle between them as $PH_{REF}$ 505 with phase errors due to component delays, etc.

Calibration component 310 computes a power and a phase angle from sample voltage 510 and sample current 512 and delays the voltage component by a phase angle gain parameter, $Y_{PH}$, 518 to produce in the feedback loop a calibrated power signal, $PWR_{FB}$, 514 with a phase angle, $PH_{FB}$, 515 to comparator 304. Comparator 304 then compares $PH_{REF}$ 505 to $PH_{FB}$ 515 and generates an error value 516 proportional to the difference between them. PI component 308 then uses error value 516 to modify $Y_{PH}$ 518 in order to attempt to eliminate error value 516 such that $PH_{FB}$ 514 becomes equal to $PH_{REF}$ 505 at comparator 304. Convergence on a calibrated value is again an iterative process, so this process repeats until $Y_{PH}$ 518 has stabilized within a defined fluctuation. At this point the calibration process stops and $Y_{PH}$ 518 is stored for voltage 506 and current 508.

So, at the end of the convergence process, and using a general relationship (2) for power in an AC circuit:

$$P = V_{RMS} * I_{RMS}(\cos\theta), \quad (2)$$

where θ is the phase angle. The calibrated power and phase angle in the circuit described above becomes:

$$\text{Calibrated Power and Phase Angle} = PWR_{FB} = V_{RMS}, I_{RMS}\cos(\theta+\theta_{error}-Y) \quad (3)$$

In an additional embodiment of the present invention, an error message or error status flag can be invoked if the convergence process fails to yield an acceptable result within a predetermined duration. The error message or status flag information can be acted upon either immediately or at a convenient later stage such as a power-up after calibration.

It has been described with reference to FIGS. 3-5 that values of $Y_{PWR}$ and $Y_{PH}$ are stored after convergence in order to be used for measurements by meter 204. This can be further explained using another block diagram.

Figure 6:
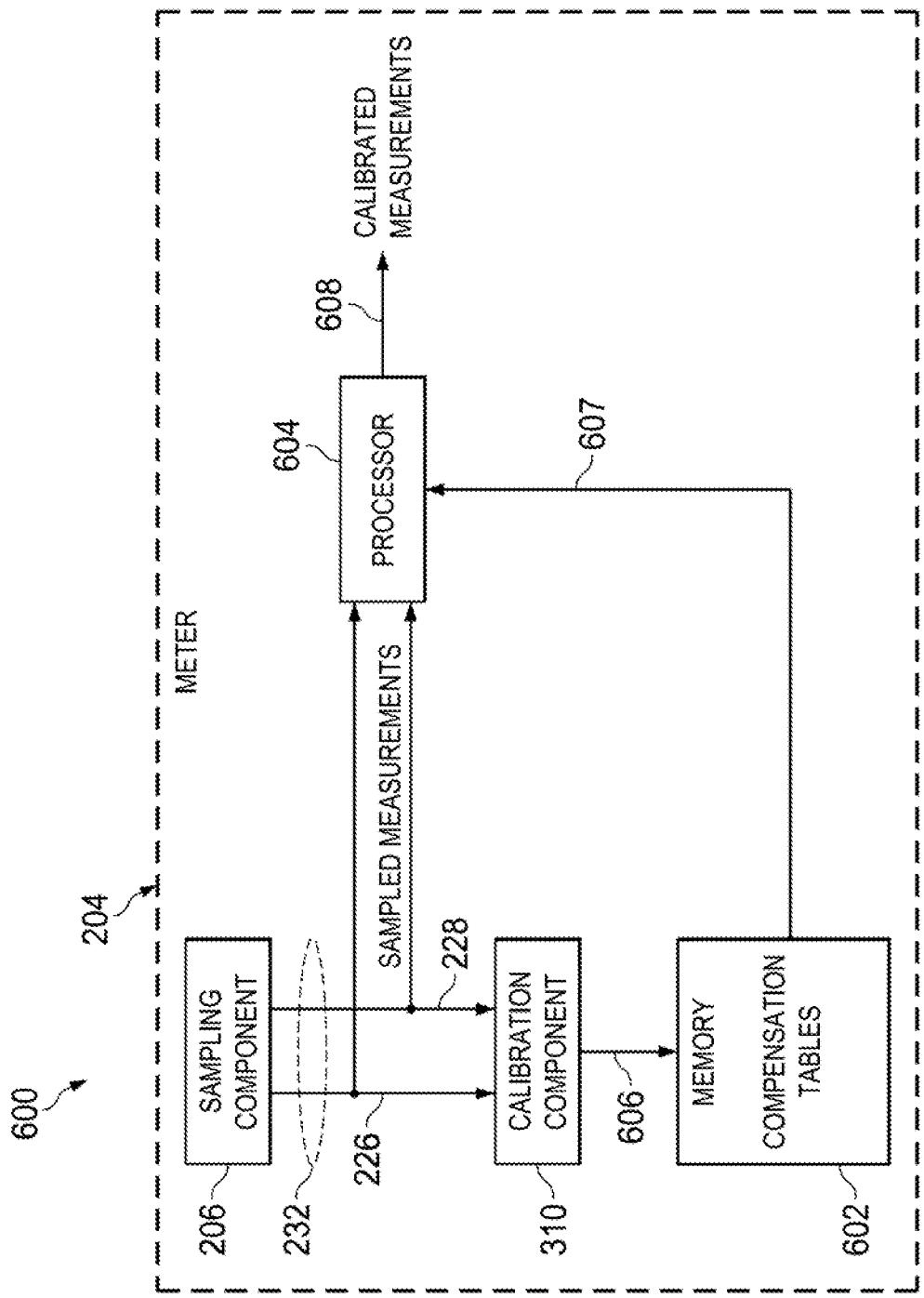
FIG. 6 shows a block diagram illustrating the additional components used to implement calibrated values for meter measurements.

FIG. 6 shows a block diagram illustrating an example system 600 used to implement calibrated values for meter measurements.

In the figure, system 600 includes sampling component 206, calibration component 310, a memory component 602 and a processor 604. Sampling component 206, calibration component 310, memory component 602 and processor 604 are shown as independent components in this example. However, in some embodiments, at least two of sampling component 206, calibration component 310, memory component 602 and processor 604 may be combined as a unitary component.

Sampling component 206 is arranged to connect to calibration component 310 and also to processor 604 via power line 232. Voltage line 225 and current line 227 represent the voltage and current components, respectively, of power line 232. Calibration component 310 connects to memory component 602 via line 606 and line 607 connects memory component 602 to processor 604. Line 608 is arranged as an output of processor 604.

Memory component 602 may be any device or system that is able to provide data storage and processor 604 is operable to process data.

In operation, calibration component 310 determines various power and phase calibration values, i.e. various values of $Y_{PWR}$ and $Y_{PH}$ determined during a series of calibration stages as described for FIG. 3-FIG. 5. As they are converged upon and generated, these values are stored in memory component 602 and are tabulated with the measured power and phase angle conditions they represent. When meter 204 is out of calibration mode and is called upon to make real measurements, processor 604 fetches the tabulated calibration values and applies equations (1) and (3) described earlier to modify the gain and phase angle of the measured values received from sampling component 206. Thus processor 604 produces calibrated, and therefore accurate, readings via line 608.

It has been described how a system and method in accordance with aspects of the present invention can be used to calibrate power gain and phase angle in order for an electricity meter to realize accurate energy readings under conditions of active and reactive power loads. It has been explained how a such a system and method, by embedding circuitry in the meter itself, can be used to provide automation of what is conventionally a lengthy, manual process, especially under conditions of low current and multiple gain settings, significant and important advantages in calibration complexity, time and manual labor can be realized.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A method of calibrating a device, said method comprising:
   providing, via a reference component, a reference power signal based on a voltage instruction and a current instruction;
   sampling, via a sampling component, a voltage signal to obtain a sampled voltage value;
   sampling, via the sampling component, a current signal to obtain a sampled current value;
   generating, via a calibration component, a calibrated power signal based on the sampled voltage value and the sampled current value;

generating, via a comparing component, an error signal based on the reference power signal and the calibrated power signal; and calibrating, via a feedback system including a proportional integral component and the calibration component, the gain of the sampled voltage and the sampled current based on the error signal.

2. The method of claim 1, wherein said calibrating the gain comprises:

generating, via the proportional integral component, a gain parameter based on the error signal; and generation, via the calibration component, a second calibrated power signal based on the gain parameter.

3. The method of claim 2, further comprising:

sampling, via the sampling component, the voltage signal to obtain a second sampled voltage value, and sampling, via the sampling component, the current signal to obtain a second sampled current value, wherein said generating a second calibrated power signal comprises generating the second calibrated power signal based on the second sampled voltage value and the second sampled current value.

4. The method of claim 3, wherein said sampling a voltage signal comprises providing, from the reference component and to a power source, a voltage instruction, wherein said sampling a voltage signal further comprises providing, from the power source and to the sampling component, the voltage signal based on the voltage instruction, wherein said sampling a current signal comprises providing, from the reference component and to the power source, a current instruction, and wherein said sampling a current signal further comprises providing, from the power source and to the sampling component, the current signal based on the current instruction.

5. The method of claim 4, further comprising:

providing, via the reference component, a second reference power signal based on a second voltage instruction and a second current instruction;

sampling, via the sampling component, a second voltage signal to obtain a third sampled voltage value;

sampling, via the sampling component, a second current signal to obtain a third sampled current value, the second current signal being offset from the second voltage signal by a phase angle;

generating, via the calibration component, a third calibrated power signal based on the third sampled voltage value and the third sampled current value;

generating, via the comparing component, a second error signal based on the second reference power signal and the third calibrated power signal;

calibrating, via the feedback system, a second phase angle between the second voltage signal and the second current signal based on the error signal.

6. The method of claim 1, wherein said sampling a voltage signal comprises providing, from the reference component and to a power source, a voltage instruction, wherein said sampling a voltage signal further comprises providing, from the power source and to the sampling component, the voltage signal based on the voltage instruction, wherein said sampling a current signal comprises providing, from the reference component and to the power source, a current instruction, and wherein said sampling a current signal further comprises providing, from the power source and to the sampling component, the current signal based on the current instruction.

7. The method of claim 6, further comprising:

providing, via the reference component, a second reference power signal based on a second voltage instruction and a second current instruction;

sampling, via the sampling component, a second voltage signal to obtain a second sampled voltage value;

sampling, via the sampling component, a second current signal to obtain a second sampled current value, the second current signal being offset from the second voltage signal by a phase angle;

generating, via the calibration component, a second calibrated power signal based on the second sampled voltage value and the second sampled current value;

generating, via the comparing component, a second error signal based on the second reference power signal and the second calibrated power signal;

calibrating, via the feedback system, a second phase angle between the voltage signal and the current signal based on the error signal; and calibrating, via the feedback system, a phase angle between the voltage signal and the current signal based on the error signal.

8. The method of claim 1, further comprising:

providing, via the reference component, a second reference power signal based on a second voltage instruction and a second current instruction;

sampling, via the sampling component, a second voltage signal to obtain a second sampled voltage value;

sampling, via the sampling component, a second current signal to obtain a second sampled current value, the second current signal being offset from the second voltage signal by a phase angle;

generating, via the calibration component, a second calibrated power signal based on the second sampled voltage value and the second sampled current value;

generating, via the comparing component, a second error signal based on the second reference power signal and the second calibrated power signal;

calibrating, via the feedback system, a second phase angle between the voltage signal and the current signal based on the error signal; and calibrating, via the feedback system, a phase angle between the voltage signal and the current signal based on the error signal.

9. A system for calibrating a device, said system comprising:

a reference component operable to provide a reference power signal based on a voltage instruction and a current instruction;

a sampling component operable to sample a voltage signal to obtain a sampled voltage value and to sample a current signal to obtain a sampled current value;

a calibration component operable to generate a calibrated power signal based on the sampled voltage value and the sampled current;

a comparing component operable to generate an error signal based on the reference power signal and the calibrated power signal; and a proportional integral component, wherein said proportional integral component and said calibration component are a feedback system that is operable to calibrate the gain of the sampled voltage and the sampled current based on the error signal.

10. The system of claim 9,
wherein said proportional integral component is operable to generate a gain parameter based on the error signal, and
wherein said calibration component is further operable to generate a second calibrated power signal based on the gain parameter.

11. The system of claim 10,
wherein said sampling component is further operable to sample the voltage signal to obtain a second sampled voltage value and to sample the current signal to obtain a second sampled current value, and
wherein said calibration component is operable to generate the second calibrated power signal based on the second sampled voltage value and the second sampled current value.

12. The system of claim 11, further comprising:
a power source,
wherein said reference component is further operable to provide a voltage instruction to the power source,
wherein said power source is operable to provide the voltage signal, based on the voltage instruction, to said sampling component,
wherein said reference component is further operable to provide a current instruction to said power source, and
wherein said power source is operable to provide the current signal, based on the current instruction, to said sampling component.

13. The system of claim 12,
wherein said reference component is further operable to provide a second reference power signal based on a second voltage instruction and a second current instruction,
wherein said sampling component is further operable to sample a second voltage signal to obtain a third sampled voltage value and to sample a second current signal to obtain a third sampled current value, the second current signal being offset from the second voltage signal by a phase angle,
wherein said calibration component is further operable to calibrate a third calibrated power signal based on the third sampled voltage value and the third sampled current value,
wherein said comparing component is further operable to generate a second error signal based on the second reference power signal and the third calibrated power signal, and
wherein said feedback system is further operable to calibrate a second phase angle between the second voltage signal and the second current signal based on the error signal.

14. The system of claim 9,
a power source,
wherein said reference component is further operable to provide a voltage instruction to the power source,
wherein said power source is operable to provide the voltage signal, based on the voltage instruction, to said sampling component,
wherein said reference component is further operable to provide a current instruction to said power source, and
wherein said power source is operable to provide the current signal, based on the current instruction, to said sampling component.

15. The system of claim 14,
wherein said reference component is further operable to provide a second reference power signal based on a second voltage instruction and a second current instruction,
wherein said sampling component is further operable to sample a second voltage signal to obtain a second sampled voltage value and to sample a second current signal to obtain a second sampled current value, the second current signal being offset from the second voltage signal by a phase angle,
wherein said calibration component is further operable to calibrate a second calibrated power signal based on the second sampled voltage value and the second sampled current value,
wherein said comparing component is further operable to generate a second error signal based on the second reference power signal and the second calibrated power signal, and
wherein said feedback system is further operable to calibrate a second phase angle between the voltage signal and the current signal based on the error signal.

16. The system of claim 9,
wherein said reference component is further operable to provide a second reference power signal based on a second voltage instruction and a second current instruction,
wherein said sampling component is further operable to sample a second voltage signal to obtain a second sampled voltage value and to sample a second current signal to obtain a second sampled current value, the second current signal being offset from the second voltage signal by a phase angle,
wherein said calibration component is further operable to calibrate a second calibrated power signal based on the second sampled voltage value and the second sampled current value,
wherein said comparing component is further operable to generate a second error signal based on the second reference power signal and the second calibrated power signal,
wherein said feedback system is further operable to calibrate a second phase angle between the voltage signal and the current signal based on the error signal.

* * * * *